US008028793B2

(12) United States Patent
Bard

(10) Patent No.: US 8,028,793 B2
(45) Date of Patent: Oct. 4, 2011

(54) NOISE ATTENUATING INSERTS FOR ELECTRONIC EQUIPMENT CABINETS

(75) Inventor: Seth E. Bard, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 12/563,513

(22) Filed: Sep. 21, 2009

(65) Prior Publication Data

US 2011/0067948 A1 Mar. 24, 2011

(51) Int. Cl.
*A47B 81/06* (2006.01)
(52) U.S. Cl. ......... 181/198; 181/200; 181/201; 181/205
(58) Field of Classification Search .................. 181/198, 181/200, 201, 205
See application file for complete search history.

(56) References Cited

U.S. PATENT DOCUMENTS

| 5,544,012 | A | 8/1996 | Koike ........................... 361/695 |
| 5,926,368 | A | 7/1999 | Chrysler et al. ............. 361/695 |
| 6,086,476 | A | 7/2000 | Paquin et al. ................. 454/184 |
| 6,104,608 | A | 8/2000 | Casinelli et al. ............. 361/692 |
| 6,198,627 | B1 * | 3/2001 | Roehling et al. .............. 361/688 |
| 6,745,149 | B2 | 6/2004 | Beeten ........................... 702/132 |
| 6,816,372 | B2 * | 11/2004 | Huettner et al. .............. 361/695 |
| 7,286,348 | B2 | 10/2007 | Vinson et al. ................. 361/695 |
| 7,379,299 | B2 * | 5/2008 | Walsh et al. .................. 361/695 |
| 7,385,810 | B2 * | 6/2008 | Chu et al. ................. 361/679.48 |
| 7,549,505 | B1 * | 6/2009 | Kawar ........................... 181/210 |
| 7,782,612 | B2 * | 8/2010 | Walsh et al. .................. 361/690 |
| 7,800,895 | B2 * | 9/2010 | Inoue et al. .............. 361/679.34 |
| 2006/0232945 | A1 * | 10/2006 | Chu et al. ....................... 361/724 |
| 2007/0139882 | A1 * | 6/2007 | Bartell et al. ................. 361/695 |
| 2007/0274036 | A1 * | 11/2007 | Walsh et al. .................. 361/688 |

FOREIGN PATENT DOCUMENTS

WO WO02071820 9/2002

* cited by examiner

*Primary Examiner* — Forrest M Phillips
(74) *Attorney, Agent, or Firm* — Dennis Jung

(57) ABSTRACT

A noise attenuating method, and a system thereof, for controlling acoustical noise in an electronic equipment enclosure is disclosed. The noise attenuating system includes one or more noise attenuating inserts configured to be removably attached to the electronic equipment enclosure so as to block noise from at least one electronic device contained in the electronic equipment enclosure and to channel an airflow from an inlet point to one or more outlet points of the electronic equipment enclosure. The method includes arranging one or more noise attenuating inserts within an electronic equipment enclosure such that the noise attenuating inserts simultaneously block noise from at least one electronic device contained in the enclosure and channel an airflow path circulating therein.

23 Claims, 8 Drawing Sheets

NOISE ATTENUATING INSERTS FOR ELECTRONIC EQUIPMENT CABINETS

FIELD OF INVENTION

The present invention relates to acoustical noise control, and more specifically, to a noise controlling system that includes one or more inserts of predetermined shapes made of acoustically absorptive materials for attenuating noise emitted from electronic devices in electronic equipment enclosures.

BACKGROUND OR RELATED ART

Noise and heat emitted from electronic components are two major issues that affect electronic equipment, particularly in the fields of computing and information technology (IT). Computing and IT equipment, including electronic devices such as general computers, mainframe servers, networking electronics, communications devices and the like, are generally enclosed in designated spaces such as IT rooms or closets, also referred to as data centers. In most instances, these devices are organized into what is known interchangeably as electronic equipment racks or frames. Electronic equipment racks are standardized enclosures having a front door and a back door designed for mounting multiple equipment modules. Each module is fixedly fastened to the rack. Depending on the specific application, a single electronic device (e.g. a server), or numerous ones, may be mounted onto each module. Several equipment racks adjacent to each other are typically arranged in rows in an enclosed data center. The recent advent of more powerful electronic devices in smaller sizes and higher power loads has resulted in data centers (or even individual racks) that generate large amounts of heat. Excessive heat negatively affects computing and IT equipment performance, reliability, life expectancy, and may even cause fatal failure. One solution for alleviating the accumulation of heat in conventional data centers has been to cool the electronic equipment by circulating cool air blown by fans and/or air conditioning units. The addition of these air moving devices generates acoustical noise (hereafter "noise"). Growing environmental concerns and recognition that lengthy and unprotected exposure to high levels of noise can be detrimental to people have resulted in strict requirements to reduce electronic equipment noise.

Conventional noise attenuating systems generally require large operating spaces. Since data center space is scarce and expensive, if users desire to enhance the cooling efficiency of electronic equipment enclosures such as racks in data centers, it can only be done at the expense of sacrificing acoustical solutions. For example, the installation of heat removing solutions such as a rear door heat exchanger or the like can only be done by eliminating an acoustical cover. Moreover, if noise attenuating solutions are needed in places where excessive noise exists, bulky noise reducing solutions (e.g., acoustical covers) may be impossible to be installed due to lack of space.

SUMMARY

The various embodiments of the present invention address the foregoing problems by providing a noise attenuating method, and a system thereof, for controlling acoustical noise in an electronic equipment enclosure. The noise attenuating system includes one or more noise attenuating inserts configured to be removably attached to the electronic equipment enclosure so as to block acoustical noise from at least one electronic device contained in the electronic equipment enclosure and to channel an airflow from an inlet point to one or more outlet points of the electronic equipment enclosure such that the airflow is evenly distributed to the outlet points selectively channeled to predetermined electronic devices. The method includes arranging of the one or more noise attenuating inserts within an electronic equipment enclosure such that the noise attenuating inserts simultaneously block noise from at least one electronic device contained in the enclosure and channel an airflow path circulating therein.

In one embodiment, a system for controlling noise in an electronic equipment cabinet is disclosed. The noise attenuating system includes a frame extender attached to the electronic equipment cabinet and one or more noise attenuating inserts removably attached to the frame extender, each of the noise attenuating inserts is configured in a predetermined shape, when so configured the noise attenuating inserts simultaneously block noise from at least one electronic device contained in the electronic equipment cabinet and channel an airflow path within the frame extender. At least part of the one or more noise attenuating inserts is placed in the airflow path to channel the airflow path from a high velocity inlet point to a lower velocity outlet point.

In one embodiment, the one or more noise attenuating inserts are placed in a removable panel member, and the removable panel member is removably attached to the frame extender. In an alternate embodiment, the noise attenuation system also includes a door attached to the frame extender, and the removable panel member is attached to the door such that the attenuating inserts protrude into the frame extender.

In a further embodiment, the system includes a heat exchanger configured to cool air passing therein. In this embodiment, the frame extender and the one or more noise attenuating inserts are positioned between the electronic equipment cabinet and the heat exchanger.

In accordance with another embodiment, a cabinet for housing one or more electronic devices is disclosed. The cabinet includes a front door and a back door attached to the cabinet; a removable panel member configured to be removably attached to the cabinet; and one or more noise attenuating inserts selectively arranged in the removable panel member such that the noise attenuating inserts block noise from at least one electronic device contained in the cabinet and such that the noise attenuating inserts channel an airflow path within the cabinet. Each of the noise attenuating inserts is made of at least one of an acoustical foam, a fiberglass material and a graphite foam; and each of the noise attenuating inserts has a predetermined shape. In alternative embodiments, the noise attenuating inserts may be formed of any acoustically absorptive material.

In accordance to at least one embodiment of the present invention, a noise attenuating solution and improved cooling results may be readily obtained by a novel noise attenuating method for controlling noise in an electronic equipment cabinet. The noise attenuating method includes arranging one or more noise attenuating inserts in a removable panel member, the one or more noise attenuating inserts being configured to block noise from at least one electronic device contained in the cabinet and to channel an airflow path from an inlet point to one or more outlet points such that the airflow is evenly distributed to the outlet points or selectively channeled to predetermined electronic devices. Each of the noise attenuating inserts has a predetermined shape such that when at least one of the noise attenuating inserts is placed within the airflow path, the insert serves to channel the airflow path from an inlet point to one or more outlet points within the electronic equipment cabinet so as to improve cooling of electronic devices contained in the cabinet.

Other embodiments and advantages thereof may be readily inferred by those of ordinary skill in the art, by reading the detailed description of the disclosure in reference to the attached drawings.

DETAILED DESCRIPTION

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification and claims, specify the presence of stated features, integers, steps, operations, elements, and/or components, but do not preclude the presence or addition of one or more other features, integers, steps, operations, elements, components, and/or groups thereof.

Figure 1:
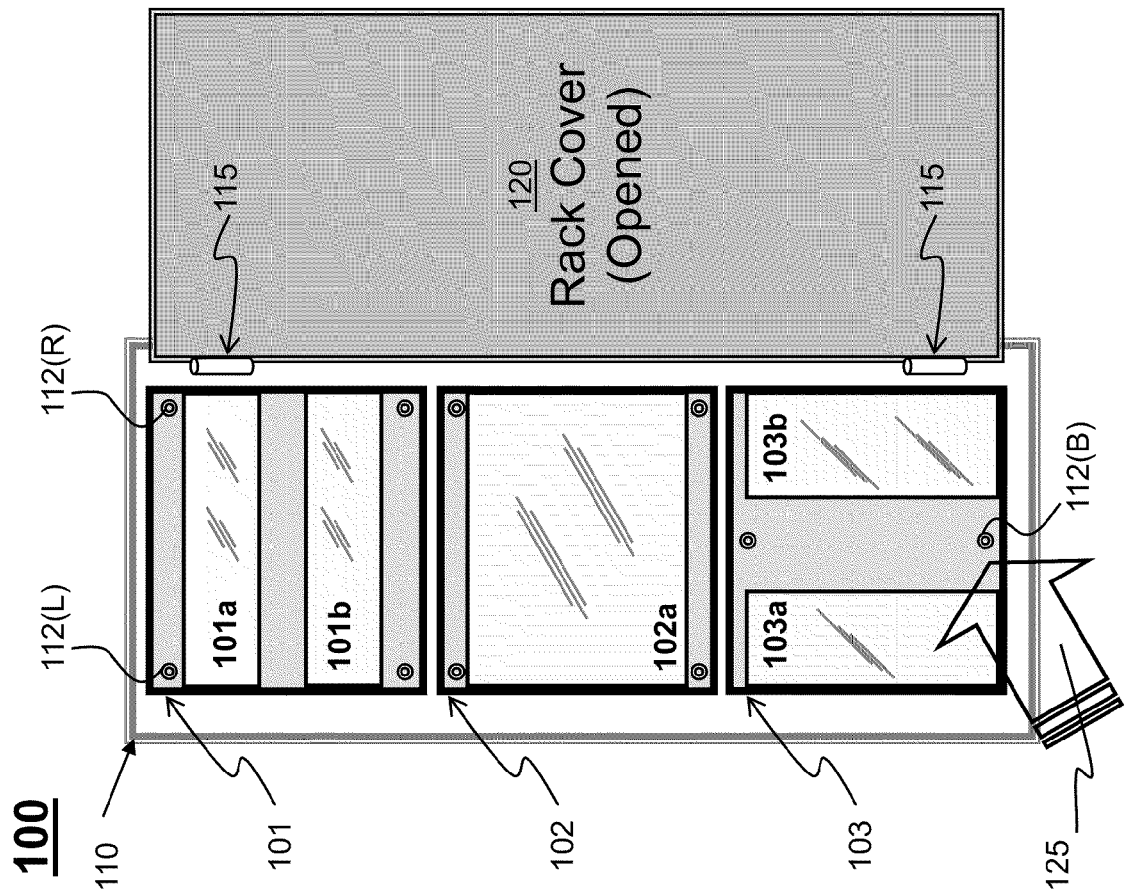
FIG. 1 illustrates an embodiment of a noise attenuating system in accordance with the present invention.

In the following description, reference is made to the accompanying drawings where like reference numerals refer to like parts throughout the disclosure. FIG. 1 illustrates one embodiment of a noise attenuating system 100 for controlling acoustical noise in an electronic equipment cabinet in accordance with the present invention. As used herein, the term "electronic equipment cabinet" is interchangeably referred to as a "rack", "enclosure" and/or "frame". In this embodiment, the noise attenuating system 100 for controlling noise in an electronic equipment cabinet or enclosure 110 includes one or more noise attenuating inserts arranged within enclosure 110. However, for ease of assembly and disassembly, the one or more noise attenuating inserts may be placed in an insert panel. In the embodiment of FIG. 1, the one or more noise attenuating inserts are illustrated as being arranged in one or more panels 101, 102 and 103. Panels 101 to 103 are configured to be attached to enclosure 110. Preferably, the panels 101, 102 and 103 are also configured to be removable from enclosure 110 so as to allow access to electronic devices contained in the enclosure. Each of panels 101 to 103 contains therein a predetermined number of noise attenuating inserts or at least one noise attenuating insert; and each noise attenuating insert has a predetermined shape. The noise attenuating inserts are preferably placed within an airflow path so as to channel the airflow path from an inlet point to one or more outlet points so as to enhance cooing of electronic devices residing within the electronic equipment cabinet or enclosure 110.

In FIG. 1, enclosure 110 may be part of the electronic equipment cabinet or may be a frame extender. Electronic equipment cabinets such as IT or computing racks most generally include a hinged front door and a hinged back door, and are typically configured to accommodate one or more electronic devices such as computers, servers, private branch exchangers (PBXs) or the like. There are many different types of racks readily available from manufactures nowadays. Typically, most of the racks are manufactured under specific industry standards, for example, the Electronics Industry Alliance (EIA) standard. Under these standards, the 19-inch rack format is often considered as the "standard" rack arrangement and is widely used to house electronic devices in telecommunications, computing, audio, entertainment and other industries. Accordingly, one example of enclosure 110 is a 19-inch rack (e.g., EIA™ 310-D) which is manufactured in accordance with the EIA standard. Another example of enclosure 110 may be of anyone of racks NetBAY42 Enterprise Rack, IBM S2 42U Rack or IBM S2 25U Rack, each of which is available from International Business Machines (IBM) of Armonk, N.Y., the assignee of the present application. Alternatively, enclosure 110 may be simply an extension of the electronic equipment cabinet or rack (also referred to as a "frame extender") that is designed to be fixedly attached to the rack.

Frame extenders are accessories configured to be fixedly attached to racks. A frame extender may be required, for example, when the space available within a rack has been completely allocated to electronic devices and additional space is required for further installations. One instance in which a frame extender is typically required is when there is no space for cabling within the rack. In such an instance a structure with dimensions compatible to the dimensions to the rack can be attached to the front or back of the rack. One example of frame extender is part number M/T 7040-W42 frame extender, EMC skirts, and cable retainers for extended frames for Cluster 1600 pSeries High Performance Switch (HPS) available from IBM of Armonk, N.Y. The pSeries HPS switch only frame, for example is available with a four inch extender. The four inch extender can accommodate up to two pSeries HPS switches and their associated switch cables. However, if more than two switches are to be installed into the frame, the increased cable load requires a larger extender. Thus, as an example, a frame extender may be part number M/T 7040-W42 frame extender.

Referring back to FIG. 1, enclosure 110 houses therein one or more panels 101, 102 and 103, each of which holds one or more noise attenuating inserts positioned in close proximity or adjacent to predetermined electronic devices (not shown). A rack cover 120 (shown open) is attached to enclosure 110, for example, via pivotable hinges 115 located on a side (right side in FIG. 1) of a front surface of enclosure 110. Alternatively, rack cover 120 may attached to enclosure 110 via other attaching means such as snap-on connectors, sliding guides, rolling casters, or the like. In yet other arrangements, rack cover 120 may not be attached at all, but simply placed very close (adjacent) to enclosure 110. Noise attenuating inserts 101a and 101b, each having a predetermined shape (e.g., each rectangular in this embodiment), have been arranged within a panel 101 (panel member). Similarly, noise attenuating insert 102a having a predetermined shape (e.g., substantially square in this instance) has been arranged in a panel 102. Finally, noise attenuating inserts 103a and 103b each having a predetermined shape (both rectangular in FIG. 1) are arranged in panel 103.

Each of panels 101, 102 and 103 may be removably attached to enclosure 110, by using readily available fastening means (as described in more detail in reference to FIG. 2 below). For example, panels 101 and 102 are shown as being attached to enclosure 110 via fastening means 112(L) located on the left side of the front of enclosure 110, and fastening means 112(R) located on the right side of the front of enclosure 110. Alternatively, panel 103 is shown as being attached to enclosure 110 by fastening means 112 (B) located in the bottom of enclosure 110. Panel 103 holds attenuating inserts 103a and 103b strategically placed in an airflow path 125. Noise reducing inserts 103a and 103b are preferably so chosen and arranged to, for example, channel the air in the airflow path 125 to desired electronic devices (not shown) residing inside the enclosure 110 to thereby ensure a more efficient cooling effect. Alternatively, noise reducing inserts may channel airflow path 125 from a front section of the enclosure 110 to a back section (not shown) so as to redistribute the airflow path to create a desired airflow distribution. Preferably a desired airflow distribution may be one in which air from an inlet point is channeled to one or more outlet points, or a distribution in which air from the back of the rack is evenly distributed to a rear door heat exchanger (RDHx).

More specifically, as it is known to those skilled in the art, data centers typically circulate cool air at high-speed through cold aisles between rows of facing racks whereby the cool air enters the rack through predetermined inlets, and hot air exits through the back of the rack onto hot aisles. The RDHx feature is a water-cooled device that is mounted on the rear of the rack to actively cool the hot air exiting at back the rack. A supply hose delivers chilled and conditioned water to the heat exchanger. A return hose delivers warmed water back to a water pump or chiller. Each rear door heat exchanger may remove up to 50,000 British thermal units (BTUs) or approximately 15,000 watts of heat.

In such an environment, noise attenuating inserts 103a and 103b, for example, are preferably placed in the vicinity of an inlet point so as to redirect (channel) the airflow path passing through the inlet point and distribute the airflow into a desired airflow distribution. Alternatively, noise attenuating inserts may be placed at the back of the rack so as to channel an airflow path of hot air exiting at the back of the rack and to create an evenly distributed airflow to pass through a rear door heat exchanger. Examples of such airflow distributions are discussed in detail hereinbelow in reference to FIGS. 7 and 8. Thus, the predetermined shapes of noise attenuating inserts serve to block noise emission from at least one electronic device, while simultaneously directing the airflow path to create a desired airflow distribution. Because in the arrangement of FIG. 1 the noise attenuating inserts are strategically placed so as to reduce noise of at least one electronic device arranged within enclosure 110 and to channel air from an airflow path, panels 101, 102 and 103 are considered to be in an operating position. In contrast, when the noise attenuating inserts are not in the operating position (e.g., when they are removed to allow access to components contained in the rack), panels 101, 102 and 103 are considered to be in a removed or non-operating position.

In the embodiment of FIG. 1, the noise attenuating inserts are preferably made of readily available acoustical materials. The acoustical material of the noise attenuating inserts is not limited to any specific material. As long as the inserts can substantially attenuate any noise emanating from electronic devices residing within the rack, and as long as the attenuating inserts are designed in a modular manner such as building blocks of predetermined shapes, noise attenuating inserts can be made of any acoustically absorptive material. The term "modular" as used herein preferably means being designed or constructed with standardized units or dimensions allowing flexibility and variety in use. For example, a set of modules or modular parts allow flexibility in the way that they are combined. Some examples of acoustically absorptive materials suitable for creating modular building blocks of predetermined shapes are acoustical foam, fiberglass, graphite foam, or the like. However, as stated above, modular blocks of noise attenuating inserts may be manufactured of any acoustically absorptive material.

Acoustical foam panels, such as polyurethane polyester or melamine foam panels, are widely known and are typically used in audio recording studios. One example of a suitable sound absorbing material is PYRELL®, a polyester polyurethane foam material manufactured by the Silicone Products Division of General Electric and by Foamex International, Inc., a division of Trace International. This type of acoustical foam is also readily available under the trademark names of Sonex®, Ready Traps™, Soft Sound®, and Class A™ Acoustical Foam Panels. Fiberglass padding is also a well known noise attenuating material and has been used to passively attenuate noise emanating from computers. In recent years, high thermal conductivity graphite foams have been developed by Oak Ridge National Laboratory under the direction of the U.S. Department of Energy (DOE) Office of Transportation Technologies. The graphite foam is presently available from Poco Graphite Inc. under the trademark name of POCOFoam®. Graphite foam is very thin and made of highly oriented graphite. The graphite foams have been estimated to exhibit a thermal conductivity greater than 1700 W/m·K. Thus, for high-end electronic devices, heat/noise attenuating inserts made of graphite foam would be extremely beneficial.

It should be noted therefore that, in accordance with at least one embodiment, it is preferable that the noise attenuating inserts be modularly designed such that each insert has a predetermined shape, and that the predetermined shapes be easily combinable. Predetermined shapes may include specific geometrical shapes that can be combined to optimize noise attenuation and/or airflow distribution functions. For purposes of illustration, various examples of predetermined geometrical shapes are discussed throughout this specification. However, predetermined shapes are not limited to geometrical shapes alone. For example, predetermined shapes may also include more elaborate shapes, such aerodynamically curved shapes that may advantageously increase air moving efficiency. Modular blocks (preconfigured or predetermined shapes) of noise attenuating inserts can deliver more performance per floor space than traditional acoustical covers, in particular if thin acoustical materials are used. In addition, modular blocks of noise attenuating inserts can, for example, (1) be custom tailored to suit acoustical and/or cooling needs of specific devices or systems; (2) be reused across multiple systems, (3) eliminate concerns regarding the lifting weight of conventional acoustical covers, (4) facilitate recycling requirements, among others. Thus, it is considered that by providing the noise attenuation inserts in a variety of shapes such as rectangular, square, triangular, circular, semicircular, trapezoidal, hexagonal shapes or the like, the inserts may be made customizable to fit predetermined electronic devices to optimize the noise attenuating function, and/or can be made customizable to be placed in specific airflow paths to channel air into a desired flow. To that end, the noise attenuating inserts in predetermined shapes may be designed to conform to specific shapes or sizes of at least some of the most widely known electronic devices and/or equipment racks available in the market.

For example, particularly heat-sensitive and noise-generating electronic devices such as servers or uninterruptible power supply (UPS) systems may be targeted as high-end devices requiring specific noise attenuating inserts. Thus, a combination of predetermined shapes configured to satisfy specific acoustical and/or cooling requirements of high-end devices may be made available to consumers as a "premium" kit of parts. Cooling and/or acoustical needs of more generic components (e.g., rack mountable routers, switches, or the like) may be satisfied by selectively placing modular noise attenuating inserts in strategic locations in the vicinity of, or in contact with, a predetermined device so as attenuate noise and/or enhance cooling. Thus, noise attenuating inserts in a variety of shapes and sizes, preferably configured to fit a variety of generic electronic devices, may preferably be offered to consumers as a "generic" kit of parts. One of the advantages of providing modular noise attenuating inserts tailored for specific electronic devices is that the inserts may be easily placed either in the front or back door of electronic equipment cabinets (e.g., racks or frames) so as to channel air from an airflow path to those specific devices without causing airflow impedance. In addition, when noise attenuating inserts are arranged in panels (as shown in FIG. 1), the modularity of the inserts may greatly facilitate maintenance work and/or recycling initiatives by enabling replacement of only a predetermined insert (or panel) when the product reaches its lifecycle end.

Returning to the embodiment of FIG. 1, as stated above, enclosure 110 may be part of the rack itself (where electronic devices are housed), or it may be a frame extender. A frame extender may be required in a case where the space within the rack has been completely allocated to electronic devices housed therein and no space is available to accommodate the attenuation inserts. Regardless of whether housing 110 is a rack or a frame extender, the attenuating inserts are either placed in insert panels, or directly attached to housing 110. For example, if highly efficient acoustical materials such as graphite foams are used to manufacture the inserts, such inserts may be easily accommodated within the rack itself. Alternatively, if no space is available within the rack, a frame extender should be preferably used to mount the noise attenuating inserts. Whether enclosure 110 is a frame extender or part of the rack itself, it is preferable that the attenuating inserts be mounted onto enclosure 110 in a manner that the inserts can be easily removed and replaced. It is even more preferable that attenuating inserts be removably mounted onto enclosure 110 by fasteners that can be removed without tools or with the minimum use of tools. Therefore, when access to electronic equipment is required, the noise attenuating inserts may be readily taken apart and replaced with ease. As general recommendation, it is preferable that the least number of different types of fasteners be used. Plastic or metallic fasteners may be equally suitable as long as the fasteners may be designed for repeated assembly and disassembly. One example of fasteners designed for repeated assembly and disassembly are snap fit fasteners such as annular snaps, dart connectors, cantilever hooks or the like. Another example of fasteners designed for repeated assembly and disassembly are pivotable hinges. Hinges may be molded in or may be attached (e.g., by welding or bonding) to enclosure 110.

Figure 2:
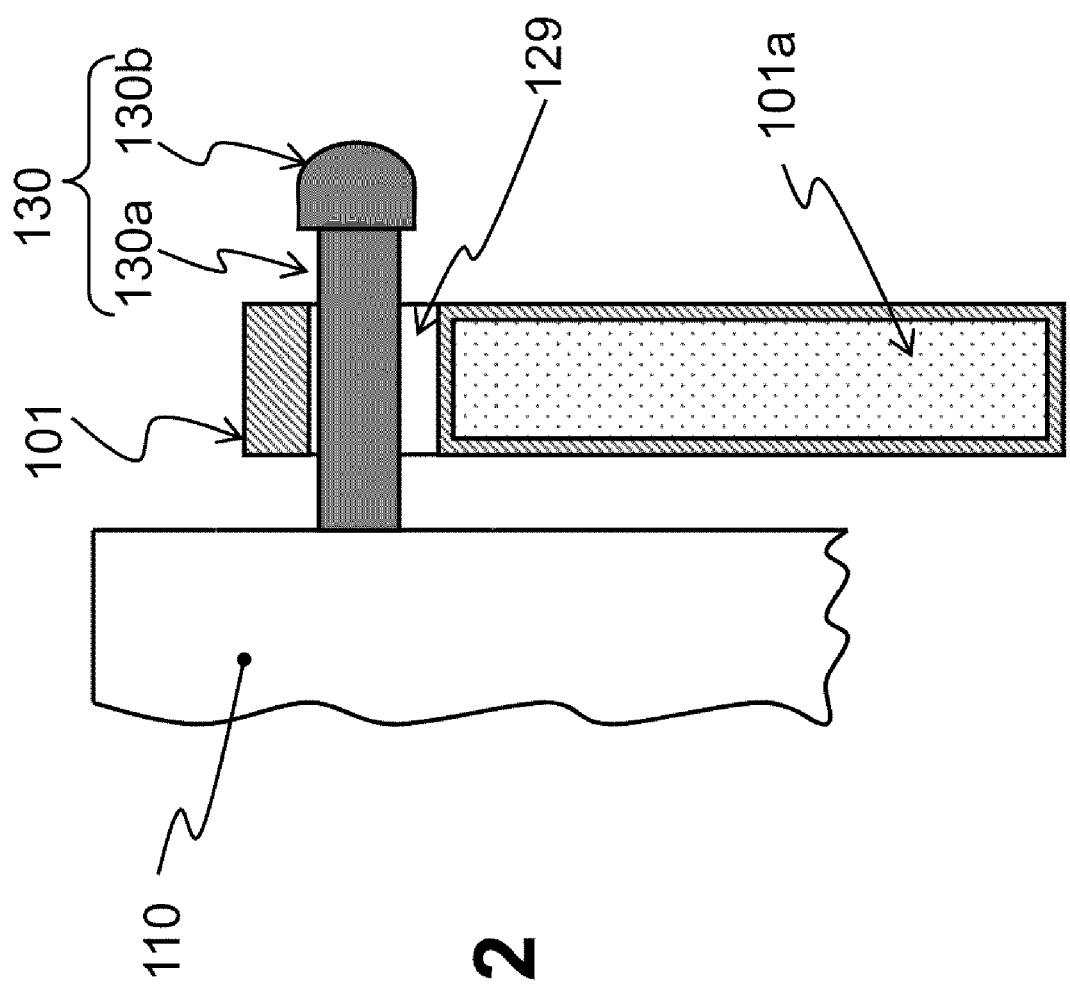
FIG. 2 illustrates a side view of one example for fastening noise attenuating inserts to an electronic equipment rack.

FIG. 2 illustrates one example of how panel 101 may be removably mounted onto enclosure 110 by means of readily available fasteners. Specifically, in FIG. 2, panel 101 including therein noise attenuating insert 101a is shown as being removably mounted to enclosure 110 by means of a dart-shaped connector 130. Dart-shaped connector 130 includes a supporting portion 130a and a blocking portion 130b. Panel 101 may preferably configured with a through-hole 129 that has a diameter larger than both the supporting portion 130a and the blocking portion 130b of the dart-shaped connector 130. Naturally, for purposes of illustration, the proportions of the parts illustrated have been exaggerated, and/or are not drawn to scale.

What is relevant in FIG. 2 is that panel 101 may be easily and quickly mounted onto (or removed from) the enclosure 110 by merely aligning the through-hole 129 with dart-shaped connector 130, then sliding the insert panel 101 in a direction parallel to the dart-shaped connector 130, and subsequently releasing the panel 101 after the panel has fully passed the blocking portion 130b. Upon mounting, panel 101 may remain in place on supporting portion 130a of dart-shaped connector 130, while blocking potion 130b prevents the panel from moving or accidentally detaching from its position. In this manner, dart-shaped connector 130 allows fast installing/removing of the noise attenuating inserts, so as to enable access to system components residing in the rack. It should be noted that although only one dart-shaped connector 130 has been illustrated, those skilled in the art may readily appreciate that each panel 101, 102 and 103 may preferably have one or more through-holes 129 conveniently located to facilitate easy mounting and removing of the panel. Correspondingly, enclosure 110 may be provided with means for fastening (e.g., threaded holes) one or more dart-shaped connectors, so that panels 101, 102 and 103 may be readily and easily mounted and removed. In other embodiments, panels 101, 102 and 103 may be pivotably hinged (attached via hinges) to at least one side of the front surface of enclosure 110. For example, panels 101, 102 and 103 may be hinged to the left side of the front surface of housing 110, in the same manner as rack cover 120 is hinged to the right side thereof (as shown in FIG. 1). Removably mounting the panel 101, as described herein, may be advantageous in allowing speedy replacement of the attenuating inserts arranged therein should such replacement be required. In addition, having the noise attenuating inserts grouped in panels (e.g., 101, 102 and 103) can eliminate concerns regarding excessive weight of the noise attenuating system during installation and/or maintenance operations, for example.

Although, in this embodiment (FIGS. 1 and 2), panels 101, 102 and 103 have been described as being used to removably mount the attenuating inserts to enclosure 110, in other embodiments, the noise attenuating inserts (e.g., the acoustical material itself) may be directly mounted onto the enclosure 110, for example, via dart-shaped connectors or any other fastening means. Alternatively, panel 101 may be snapped onto enclosure 110 via dart connector 130, e.g., by aligning through-hole 129 with dart-connector 130 and carefully applying force to panel 101. In the case that panel 101 is configured to be snapped onto enclosure 110 via connector 130, it is preferable that the through-hole 129 be made of approximately the same diameter as the blocking part 130b of dart-shaped connector 130.

Figure 3:
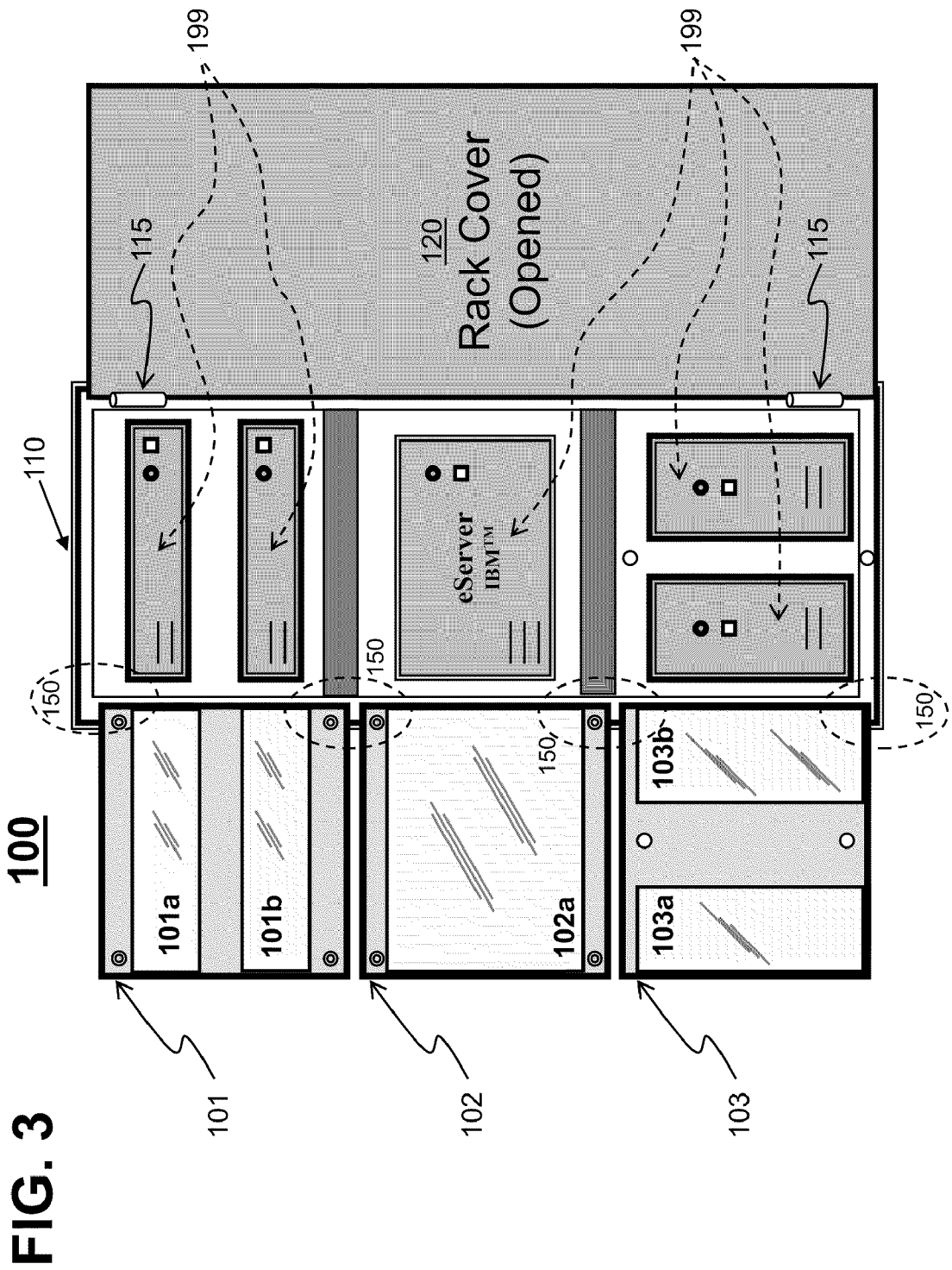
FIG. 3 illustrates the noise attenuating system of FIG. 1 in which the noise attenuating inserts are a non-operating (removed) position.

FIG. 3 illustrates the noise attenuating system 100 (of FIG. 1) in a non-operating (removed) position. Specifically, FIG. 3 is a front view of enclosure 110 housing therein a plurality of electronic devices 199, a rack cover 120 (door) pivotably attached to the right side of enclosure 110 via hinges 115, and panels 101, 102 and 103 are attached to the left side of enclosure 110. In FIG. 3, panels 101, 102 and 103 are shown in a removed position (non-operating position). A removed position, as used herein, is a position in which panels 101, 102 and 103 each holding noise attenuating inserts (101*a*-101*b*, 102*a*, and 103*a*-103*b*, respectively) are not in an operative position (i.e., the noise attenuating inserts are not adjacent to or in contact with electronic devices 199). A removed position may be necessary, for example, in a situation where access to at least one of electronic devices 199 is required.

In the case that panels 101, 102 and 103 are mounted onto enclosure 110 via dart-shaped connectors (as described above), the panels 101-103 may be physically removed from within enclosure 110 and temporarily placed (hanged) on the left side portion of the front of the enclosure 110. Temporarily placing the panels on the left side portion of enclosure 110 may be achieved by physically removing panels 101, 102 and 103 from their operating position, and attaching the panels back onto enclosure 110 by using only fastening means 112L (shown in FIG. 1) on the left side of the front of enclosure 110, e.g., at positions 150. It should be noted that not all of the panels 101 to 103 may need to be removed simultaneously. There may be situations in which only a single panel can be removed to allow access to electronic devices 199. In such a situation, a removed position of a single panel can be easily achieved in the same manner as describe above, e.g., by removing the panel from its operating poison and placing it on the left side of enclosure 110. Thus, arranging the noise attenuating inserts in removable panels may greatly reduce the time and work required for maintenance/installation operations. However, noise attenuating inserts are not limited to being arranged in one or more panels, as illustrated in the drawings. If appropriate, panels 101, 102 and 103 may be combined into one single-panel, which can still be attached to (and removed from) enclosure 110 in the manner described herein. Moreover, as stated above, the noise attenuating inserts may not require a panel at all. Indeed, if space permits, the noise attenuating inserts may, in some embodiments, be directly arranged within the enclosure 110 and removed therefrom at convenience.

In alternate embodiments, as discussed above, panels 101, 102 and 103 may be pivotably attached (hinged) to one side of the front portion of housing 110. In this manner, the noise attenuating inserts may be positioned in close proximity to (or in contact with) predetermined electronic devices, by maintaining panels 101, 102 and 103 in their operating position. However, when access to electronic devices 199 is required, panels 101, 102 and 103 may be simply pivoted towards one side of the front portion of enclosure 110, for example, as illustrated in FIG. 3. In the removed position, a selected one or all of panels 101, 102 and 103 may remain hingeably attached to enclosure 110 at points 150 in a manner similar to the open position of rack cover 120. This specific arrangement would allow for fast and easy access to electronic devices 199, while also providing an affordable and efficient acoustical and cooling solution.

Figure 4:
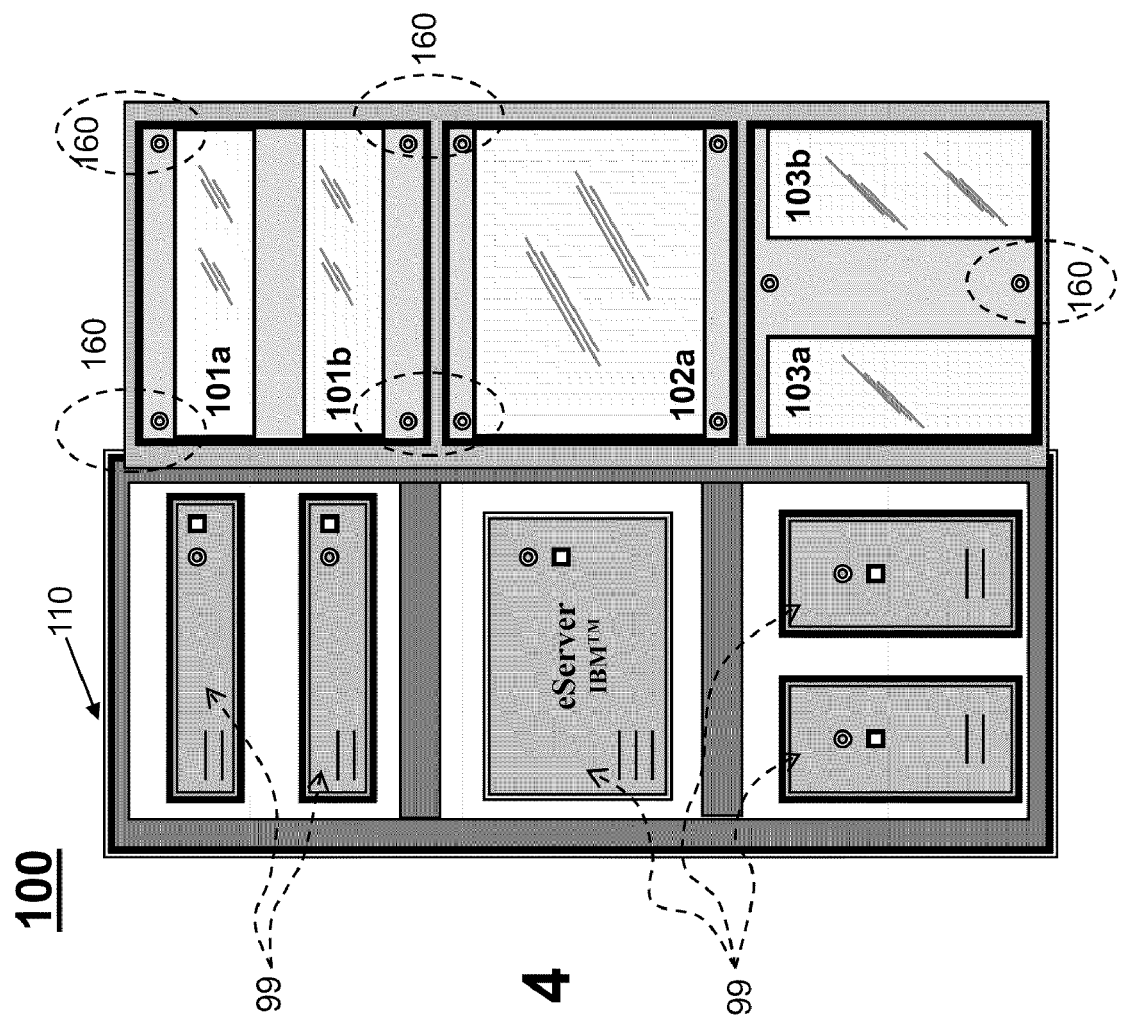
FIG. 4 illustrates an alternate arrangement of noise attenuating system of FIG. 1 in which the noise attenuating inserts are attached to a front door of the rack.

FIG. 4 illustrates an alternate arrangement of noise attenuating system 100 (of FIG. 1) in which panels 101, 102 and 103 are also shown in a removed position. In this arrangement, the panels have been removed from their operating position (i.e., from the inside of housing 110), and have been temporarily attached to the inner surface of rack cover 120. For example, panels 101 to 103 have been removed to allow access to electronic devices 199 residing in enclosure 110. Alternatively, if space permits, the panels 101, 102 and 103 may be operationally mounted on the inner surface of rack cover 120. If panels 101 to 103 are operationally mounted on rack cover 120, each of the attenuating inserts 101*a*, 101*b*, 102*a*, 103*a* and 103*b* may preferably protrude towards enclosure 110, such that when rack cover 120 is closed the inserts can be positioned in close proximity to (or in contact with) at least one of electronic devices 199. It is noted, however, that even if panels 101 to 103 are operationally attached to the inner surface of rack cover 120 (door), it may be preferable that panels 101, 102 and 103 be removably mounted so as to provide easy access to electronic devices 199 and/or to allow easy replacement of the attenuating inserts. In the arrangement of FIG. 4, panels 101, 102 and 103 may be removably mounted onto the inner surface of rack cover 120, for example, by means of dart-shaped connectors (as shown in FIG. 2) positioned at locations 160 of rack cover 120. Some of the advantages of this arrangement are that, by attaching the panel inserts to rack cover 120, (1) interference with neighboring equipment is prevented and (2) outside protruding or tapered covers, such as conventional acoustical covers, are obviated. Thus, not only fast and easy access to electronic devices is provided, but also a more aesthetically pleasing environment is obtained.

Figure 5:
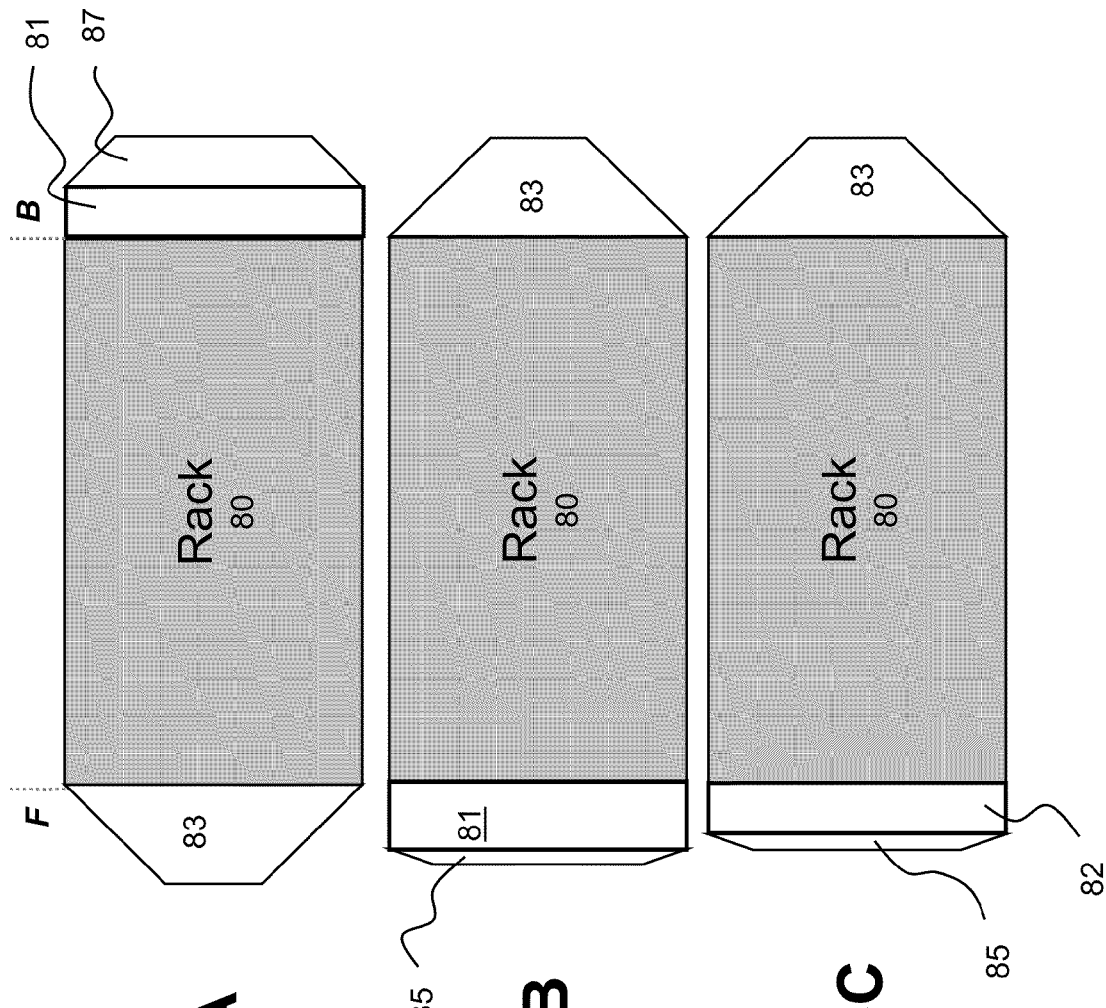
FIG. 5A shows an electronic equipment enclosure with a conventional acoustical cover attached to one side of the enclosure, a frame extender attached to another side thereof, and a rear door heat exchanger attached to the frame extender.
FIGS. 5B and 5C each shows an electronic equipment enclosure with a conventional acoustical cover attached to one side of the enclosure, a frame extender attached to another side thereof, and a thin cover (door) attached to the frame extender.

Indeed, even in the case that enclosure 110 is a frame extender, the frame extender should be fixedly attached to a front and/or back portion of the rack and only a thin rack cover 120 may be required to cover such frame extender. FIGS. 5A-5C illustrate examples of arrangements in which frame extenders 81 and 82 are shown as being fixedly attached to a rack 80. FIG. 5A illustrates a rack 80 with a conventional acoustical cover 83 on the front (F) and a frame extender 81 to which a rear door heat exchanger (RDHx) 87 may be attached. In FIG. 5A, a frame extender 81 is preferably configured to house one or more noise attenuating inserts in accordance with at least one embodiment of this invention, and it is preferably fixedly attached to the back (B) of a rack 80. In turn, attached to frame extender 81 is shown, a rear door heat exchanger 87 configured to actively cool air passing therein. In this arrangement, the noise attenuating inserts are preferably arranged within an airflow path of hot air exiting at the back of rack 80 so as to channel the airflow path towards a more uniform airflow (see, e.g., Example 2) entering the RDHx unit 87. One of the advantages of this arrangement is that the hot air exiting at the back of rack 80 may be more efficiently cooled. However, when the attenuating inserts are installed in a frame extender, as discussed herein, a more notable advantage may be the aesthetical appearance and space saving obtained by this arrangement.

For example, the arrangement shown in FIG. 5B illustrates the rack 80 of FIG. 5A with a frame extender 81 fixedly attached to the front thereto and a thin cover 85 attached frame extender 81. In the arrangement of FIG. 5B, the frame extender 81 replaces the conventional acoustical cover 83 (shown attached to front (F) of rack 80 in FIG. 5A). Since the frame extender 81 houses the attenuation inserts in accordance with at least one embodiment of this invention, the conventional acoustical cover 83 is no longer necessary. Thus, only a thin cover 85 may be preferable for covering the noise attenuating inserts residing within frame extender 81. Thin cover 85 may be, for example, a Slimline cover sold by IBM of Armonk, N.Y. Typically, the Slimline cover consists of a door without any acoustical treatment, and is approximately 2 to 4 inches deep. The frame extender 81 in combination with thin cover 85 provides an optimal acoustical solution that takes up much less floor space and is more aesthetically pleasing than a conventional acoustical cover 83. Thus, the arrangement of FIG. 5B, is advantageous at least in that it reduces footprint space and improves aesthetics.

Depending on the specific application requirements, frame extenders may be configured in a variety of sizes. For example, based on aesthetical and/or footprint requirements, some frame extenders may be designed thinner than others. FIG. 5C illustrates an arrangement in which frame extender 82, which is thinner than frame extender 81 of FIG. 5B, has been fixedly attached to a server rack 80 and is covered by a thin cover 85. Thus, the arrangement of FIG. 5C, is advantageous in that it further reduces the footprint space without degrading noise attenuation and improving cooling efficiency.

Figure 6:
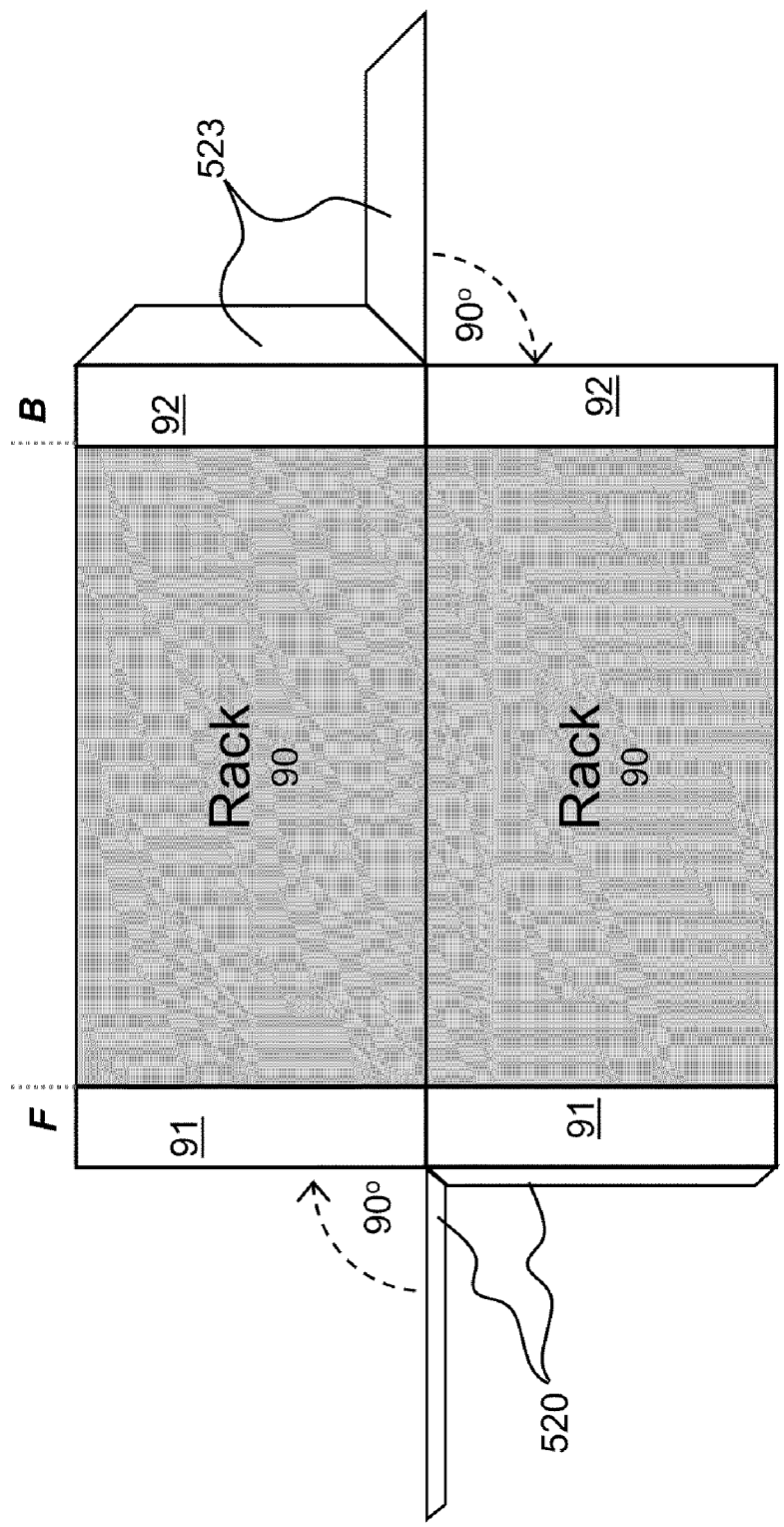
FIG. 6 illustrates a top view of footprints of equipment racks with frame extenders in combination with thin covers and rear door heat exchanger units.

FIG. 6 illustrates footprint views of a pair of racks 90 having frame extenders 91 fixedly attached to the front (F) and frame extenders 92 also fixedly attached to the back (B) of racks 90. On the back of frame extenders 92, RDHx units 523 have been pivotably mounted such that the RDHx units may be opened to at least a 90° angle, so as to allow easy access to the attenuating inserts contained in the frame extender and/or to the components included the racks. On the front of frame extenders 91, thin covers 95 (e.g., Slimline covers) have also been pivotably attached thereto so as to allow access to devices included in the racks. Thus, the advantages of installing noise attenuating inserts in frame extenders, as disclosed herein, in contrast to having the conventional acoustical covers attached to the racks, not only results in enhanced cooling performance without requiring additional space, but it also results in an improved noise attenuating solution with lighter doors attached to the racks. In summary, the noise attenuating system so described can efficiently control noise in an electronic equipment cabinet. The noise attenuating system includes one or more attenuating inserts that can be removably attached to either a frame extender or to the electronic equipment cabinet itself. The noise attenuating inserts are modular in the sense that preconfigured shapes can be selectively chosen to block noise from an electronic device contained within the electronic equipment cabinet and/or to channel an airflow path from an inlet point to several outlet points so as to form a desired distributed airflow.

EXAMPLES OF NOISE ATTENUATING SYSTEMS UTILIZING NOISE ATTENUATING INSERTS

Example 1

Figure 7:
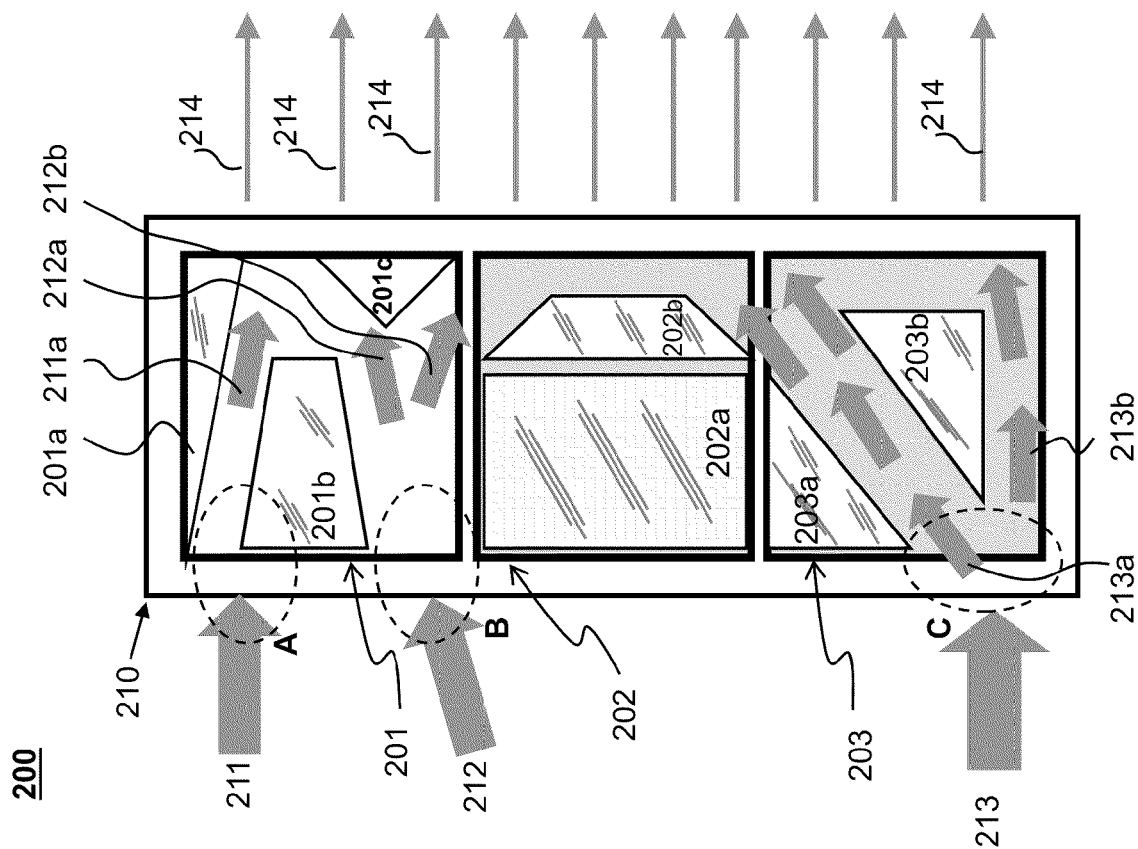
FIGS. 7 and 8 illustrate examples of noise attenuating systems utilizing noise attenuating inserts in accordance with embodiments of the present invention.

FIG. 7 illustrates a first example of a noise attenuating system 200. In noise attenuating system 200, an enclosure 210 houses therein one or more panels 201, 202 and 203, each of which contains modular noise attenuating inserts having a predetermined shape. Of the noise attenuating inserts, at least part of the inserts is placed within an airflow path so as to channel the airflow path into a desired airflow distribution directed to enhance cooling predetermined electronic devices (not shown). As previously discussed, cooling air typically flows at high-speeds through cold isles and from there the air enters enclosure 210 (e.g., a rack or frame extender) at predetermined inlet locations. In the example of FIG. 7, airflow paths 211, 212 and 213 enter enclosure 210 at inlet locations A, B and C, respectively. The one or more noise attenuating inserts contained in panels 201, 202 and 203 channel the airflow path from inlet points A, B and C to a desired airflow distribution directed towards predetermined electronic devices (not shown). Thus, the high-speed airflow paths entering housing 210 at inlet points A, B and C exit enclosure 210 at one or more outlet points as a more uniform and evenly distributed low-speed airflow 214. In the context of this example, the airflow distribution from one inlet point to one or more outlet points implies that the velocity of the air is reduced because the airflow has been transformed from a narrow stream to a larger, distributed flow area (i.e. spread out), More specifically, as illustrated in FIG. 7, panel 201 contains noise attenuating inserts 210a, 201b and 201c. Noise attenuating inserts 201a and 201b are placed within an airflow path 211 that enters enclosure 210 at inlet point A. The predetermined shapes of attenuating inserts 201a and 201b channel the high-speed airflow path 211 having a first direction to a airflow path 211a having a second direction that is different from the first direction. In this manner, high-speed airflow path 211 may be channeled, for example, to a desired electronic device (not shown) located within the new airflow path 211a. Similarly, the shapes of noise attenuating insert 201b channels the airflow path 212 entering at inlet point B. The airflow path 212, in this case, is split into airflow paths 212a and 212b due to the shape of noise attenuating insert 201c. In this manner, the attenuating inserts 201b and 201c, by virtue of their predetermined shapes, may channel the cooling air of airflow path 212 to electronic devices (not shown) located in airflow paths 212a and 212b. Panel 202 contains noise attenuating inserts 202a and 202b. The predetermined shapes of inserts 202a and 202b, in this case, are strategically located in the vicinity of a predetermined electronic device (not shown). At least attenuating insert 202b is located so as to further channel airflow path 212b. Panel 203 contains noise attenuating inserts 203a and 203b having predetermined shapes designed to channel an airflow path 213 entering enclosure 210 at inlet point C. From inlet point C, by virtue of the shapes of noise attenuating inserts 203a and 203b, airflow path 213 is channeled into airflow paths 213a and 213b, so as to guide the airflow towards desire electronic devices requiring enhanced cooling or to form a desired airflow distribution.

Example 2

Figure 8:
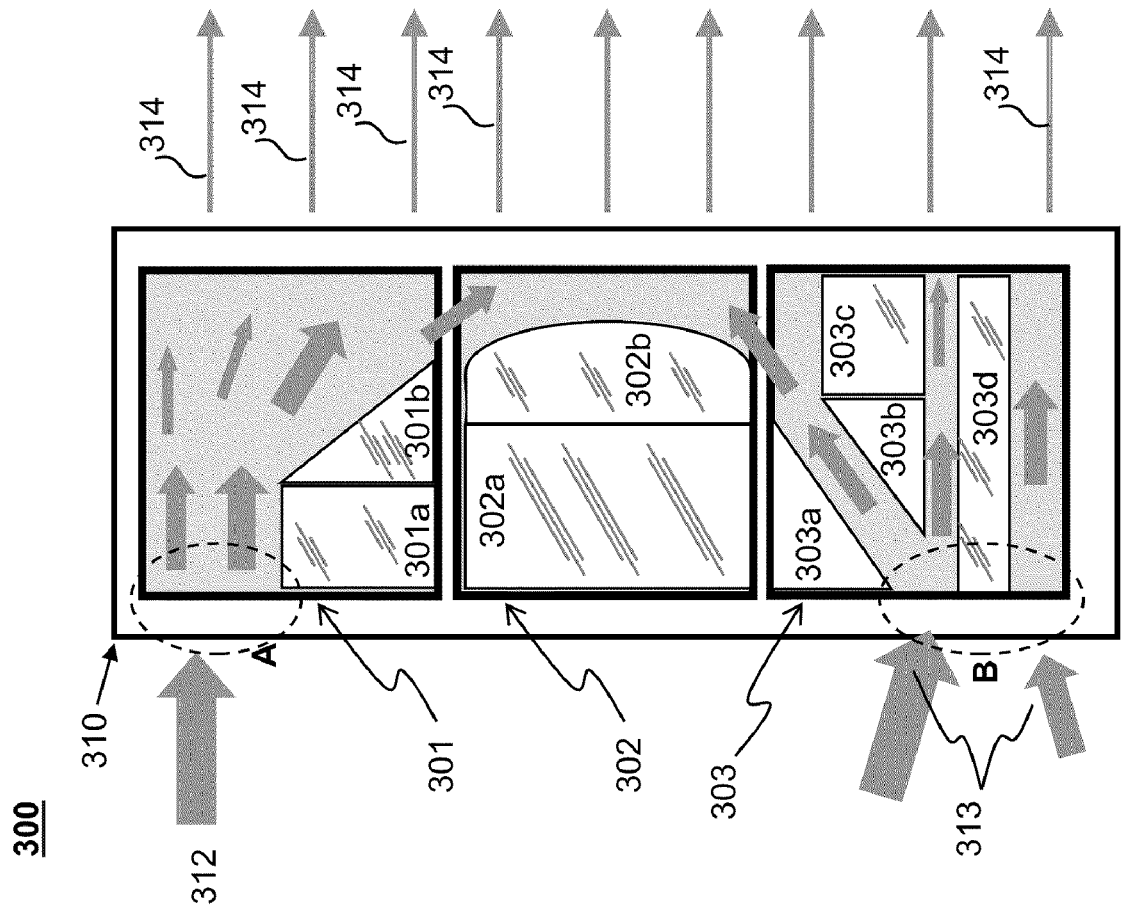

FIG. 8 illustrates a second example of a noise attenuating system 300. In this example, an enclosure 310 (e.g., frame extender) houses therein panels 301, 302 and 303, each of which contains noise attenuating inserts having predetermined shapes. Of the noise attenuating inserts, at least one insert is placed within an airflow path so as to channel the airflow into desired airflow distribution directed to, for example, a rear door heat exchanger. For example, enclosure 310 may represent frame extender 81 of FIG. 5A, and such enclosure 310 may be preferably disposed between an electronic equipment cabinet (rack 80 in FIG. 5) and a rear door heat exchanger (87 in FIG. 5A). In such an arrangement, airflow paths 312 and 313 may represent hot air exiting at the back of rack 80 and entering enclosure 310 at inlet locations A and B, respectively. The noise attenuating inserts contained in panels 301, 302 and 303 are preferably placed adjacent to or in contact with acoustical noise sources within predetermined electronic devices (not shown), and the attenuating inserts are configured to redistribute the hot air airflow from airflow paths 312 and 313 and channel the airflow towards more evenly distributed airflow 314. Airflow path 314 is preferably directed to a rear door heat exchanger so that the hot air may be actively cooled.

The manner in which noise attenuating system 300 channels the airflow within enclosure 310 is substantially similar to that of the noise attenuating system 200 of FIG. 7. In FIG. 8, noise attenuating inserts 301a and 301b have predetermined shapes that channel the airflow 312 from inlet point A towards one or more outlet points to form the evenly distributed airflow path 314. Nose attenuating inserts 303a, 303b, 303c and 303d strategically channel airflow paths 313 to one or more outlet points to form the evenly distributed airflow path 314 or to guide air to predetermined electronic devices (not shown). Noise attenuating inserts 302a and 302b may be configured to attenuate noise from an electronic device residing directly behind insert panel 302, and thus not shown. In such a case, noise attenuating insert 302b represents a noise attenuating insert having a predetermined aerodynamic shape with gently curved surfaces to reduce airflow resistance and increase air moving efficiency. It should be understood, however, that the foregoing non-limiting examples are merely illustrative. Those skilled in the art will be able to devise, based on the foregoing disclosure, other equivalent arrangements in which the various embodiments of the present invention may be implemented and practiced.

In view of the foregoing description of the various embodiments and examples of the noise attenuating system for controlling noise in an electronic equipment cabinet or rack, it is evident that numerous advantages may be obtained through the use predefined shapes (attenuating inserts) made of acoustically absorptive materials arranged in carefully selected positions. The geometry of the inserts is such that, when arranged as disclosed herein, they leave a series of openings that minimize airflow impedance while redistributing (channeling) airflow as is necessary to maximize operational efficiency of the rack's components. The noise attenuating inserts placed within the rack are easily removable, which permit rapid access to electronic devices residing in the racks, thereby improving installation and/or maintenance operations of the electronic devices and attenuating inserts alike.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The foregoing embodiments and examples were chosen and described in order to best explain the principles of the invention and the practical application, and to enable others of ordinary skill in the art to understand the invention for various embodiments with various modifications as are suited to the particular use contemplated.

What is claimed is:

1. A noise attenuating system for controlling noise in an electronic equipment cabinet, the noise attenuating system comprising:
   a frame extender configured to be attached to the electronic equipment cabinet; and
   one or more noise attenuating inserts configured to be removably attached to the frame extender, the one or more noise attenuating inserts configured to block noise from an electronic device contained in the electronic equipment cabinet.

2. The noise attenuating system of claim 1, wherein each of the one or more noise attenuating inserts has a predetermined shape.

3. The noise attenuating system of claim 1, wherein each of the one or more noise attenuating inserts includes an acoustically absorptive material.

4. The noise attenuating system of claim 1, wherein the one or more noise attenuating inserts are placed in a removable panel.

5. The noise attenuating system of claim 1, wherein said one or more noise attenuating inserts are further configured to channel airflow at a front section of the frame extender to a back section of the frame extender such that the airflow at the back section of the frame extender is of lower velocity than the airflow at the front of the frame extender.

6. The noise attenuating system of claim 1, further comprising:
   a heat exchanger configured to actively cool air passing therein; and
   wherein said frame extender and said one or more noise attenuating inserts are positioned between said electronic equipment cabinet and said heat exchanger.

7. The noise attenuating system of claim 1, wherein at least two of said noise attenuating inserts are placed within the airflow path to change a direction of flow of air so as to direct the air from an inlet point in said front section of the frame extender towards one or more outlet points in said back section of the frame extender.

8. The noise attenuating system of claim 4, wherein the removable panel is configured to be pivotably attached to the frame extender.

9. The noise attenuating system of claim 4, wherein the removable panel is configure to be snapped onto the frame extender.

10. The noise attenuating system of claim 4, further comprising:
    a door attached to the frame extender,
    wherein the removable panel is configured to be attached to the door and wherein the one or more noise attenuating inserts protrude into the frame extender.

11. A cabinet for housing one or more electronic devices, the cabinet comprising:
    A front door attached to the cabinet;
    A back door attached to the cabinet;
    A frame extender configured to be attached to the cabinet; and
    one or more noise attenuating inserts selectively arranged in the removable panel member, such that the one or more noise attenuating inserts block noise from at least one electronic device contained in the cabinet and channel an airflow path circulating therein; and
    wherein said one or more noise attenuating inserts are further configured to channel airflow at a front section of the cabinet to a back section of the cabinet such that airflow at the back section of the cabinet is of lower velocity than the airflow at the front section of the cabinet.

12. The cabinet according to claim 11, wherein each of the one or more noise attenuating inserts has a predetermined shape.

13. The cabinet according to claim 11, wherein each of the one or more noise attenuating inserts includes an acoustically absorptive material.

14. The cabinet according to claim 11 wherein the frame extender is configured to be attached to at least one of the front door and the back door and wherein the noise attenuating inserts protrude into the cabinet.

15. A method for controlling noise emanating from electronic equipment housed in a cabinet, the method comprising:
    arranging one or more noise attenuating inserts in a removable panel member, the one or more noise attenuating inserts being configured to block noise from at least one electronic device contained in the cabinet;

each of said one or more noise attenuating inserts having a predetermined shape;
at least part of said one or more noise attenuating inserts being configured to channel an airflow path from an inlet point to one or more outlet points; and
attaching a frame extender to the cabinet, wherein the removable panel member is removably attached to the frame extender.

16. The method for controlling noise of claim 15, wherein each of said one or more noise attenuating inserts include an acoustically absorptive material.

17. The method for controlling noise of claim 15, further comprising attaching the removable panel member to the cabinet.

18. The method for controlling noise of claim 15, further comprising snapping the removable panel member onto to the cabinet.

19. The method for controlling noise of claim 15, wherein
the removable panel member is configured to be removably attached to at least one of a front door and a back door of said cabinet, and
wherein the one or more noise attenuating inserts protrude into the cabinet.

20. The method of controlling noise of claim 15, further comprising placing said or more noise attenuating inserts within the airflow path to change a direction of the airflow path so as to direct the air from an inlet point towards one or more outlet points of frame extender.

21. The method for controlling noise of claim 15, wherein said one or more noise attenuating inserts are further configured to channel airflow at a front section of the frame extender to a back section of the frame extender such that the airflow at the back section is of lower velocity than the airflow at the front of the frame extender.

22. The method for controlling noise of claim 21, further comprising:
attaching a heat exchanger to the frame extender, the heat exchanger configured to actively cool air passing therein,
wherein said frame extender and said one or more noise attenuating inserts are positioned between said cabinet and said heat exchanger.

23. The method for controlling noise of claim 15, further comprising:
Attaching a door to the frame extender,
Wherein the removable panel member is configured to be attached to the door and wherein the one or more noise attenuating inserts protrude into the frame extender.

* * * * *